United States Patent
Tailliet

(10) Patent No.: US 11,321,270 B2
(45) Date of Patent: May 3, 2022

(54) DATA ENCODING ON A SERIAL BUS

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 95 days.

(21) Appl. No.: 16/840,759

(22) Filed: Apr. 6, 2020

(65) Prior Publication Data

US 2020/0327092 A1    Oct. 15, 2020

(30) Foreign Application Priority Data

Apr. 12, 2019 (FR) ..................................... 1903929

(51) Int. Cl.
| | |
|---|---|
| *G06F 13/42* | (2006.01) |
| *G06F 9/30* | (2018.01) |
| *G06F 11/07* | (2006.01) |
| *G06F 13/12* | (2006.01) |
| *G11C 7/10* | (2006.01) |
| *G11C 16/34* | (2006.01) |

(52) U.S. Cl.
CPC ...... *G06F 13/4295* (2013.01); *G06F 9/30101* (2013.01); *G06F 11/076* (2013.01); *G06F 13/126* (2013.01); *G11C 7/106* (2013.01); *G11C 7/1045* (2013.01); *G11C 7/1087* (2013.01); *G11C 16/349* (2013.01)

(58) Field of Classification Search
CPC .. G06F 13/126; G06F 13/4295; G06F 11/076; G06F 9/30101; G11C 7/106; G11C 7/1045; G11C 7/1087; G11C 16/349
See application file for complete search history.

(56) References Cited

U.S. PATENT DOCUMENTS

| | | | |
|---|---|---|---|
| 5,630,152 A * | 5/1997 | DeLuca | G06F 13/4291 700/3 |
| 9,753,665 B2 | 9/2017 | Tailliet et al. | |
| 2006/0248267 A1 | 11/2006 | Xie | |
| 2017/0090813 A1* | 3/2017 | Tailliet | G06F 3/0604 |
| 2017/0161216 A1* | 6/2017 | Hill | G06F 13/4072 |
| 2019/0244670 A1* | 8/2019 | Yeh | G06F 9/30101 |

FOREIGN PATENT DOCUMENTS

| | | |
|---|---|---|
| CN | 105468563 A | 4/2016 |
| FR | 3041806 A1 | 3/2017 |

OTHER PUBLICATIONS

INPI Search Report and Written Opinion for FR 1903929 dated Dec. 4, 2019 (9 pages).

* cited by examiner

*Primary Examiner* — Nimesh G Patel
(74) *Attorney, Agent, or Firm* — Crowe & Dunlevy

(57) ABSTRACT

A method for encoding a data value to be transmitted on an SPI serial bus includes an operation to modify a status register of a memory, at least at one chosen time instant, as a function of all or part of the data value to be transmitted.

23 Claims, 4 Drawing Sheets

DATA ENCODING ON A SERIAL BUS

PRIORITY CLAIM

This application claims the priority benefit of French Application for Patent No. 1903929, filed on Apr. 12, 2019, the content of which is hereby incorporated by reference in its entirety to the maximum extent allowable by law.

TECHNICAL FIELD

The present description generally relates to electronic circuits, and more particularly, the systems in which a plurality of circuits are capable of communicating on a serial bus.

BACKGROUND

The serial bus is already widely implemented to allow a plurality of electronic circuits of a same system to communicate with one another. In automobiles, for example, a computer frequently uses a serial bus to allow a microprocessor to read or write information in a non-volatile memory throughout the use of a vehicle.

There is a need to extend the current communication capabilities by serial bus. It would in particular be desirable to be able to take advantage of the presence of a serial bus to make it possible to encode additional information, transmissible independently of the usual communication channels.

There is a need in the art to overcome all or some of the drawbacks of the known methods for encoding data on serial buses.

SUMMARY

One embodiment provides a method for encoding a data value to be transmitted on an SPI serial bus, in which a status register of a memory is modified, at least at one chosen time instant, as a function of all or part of said data value to be transmitted.

According to one embodiment, the memory is a reprogrammable non-volatile memory.

According to one embodiment, the status register is modified by a state inversion of a latch bit of the memory in write mode.

According to one embodiment, the status register is modified during a write cycle in the memory.

According to one embodiment, the status register is modified only once during the write cycle in the memory, the data value to be transmitted forming a bit.

According to one embodiment, the status register is modified a plurality of times during the write cycle in the memory, the data value to be transmitted forming a word comprising at least two bits.

According to one embodiment, the number of modifications of the status register, during the write cycle in the memory, is related to the number of state transitions between successively transmitted bits of the word.

According to one embodiment, said data value to be transmitted is representative of wear of the memory.

According to one embodiment, said data value to be transmitted reflects a number of error corrections made within the memory.

One embodiment provides a method comprising: starting to write in the memory; sending, periodically, the status register of the memory; modifying, at said given time instant, the status register of the memory to encode all or part of the data value to be transmitted; and ceasing to write in the memory.

One embodiment provides an electronic circuit configured to implement the described method.

One embodiment provides a non-volatile memory comprising a status register configured to be modified by the implementation of the described method.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the generation of signals as a function of the data to be transmitted over a serial bus and the reception of these signals by a reception circuit have not been detailed, the described embodiments and implementation modes being compatible with the usual transmissions between two or more circuits over a serial bus.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
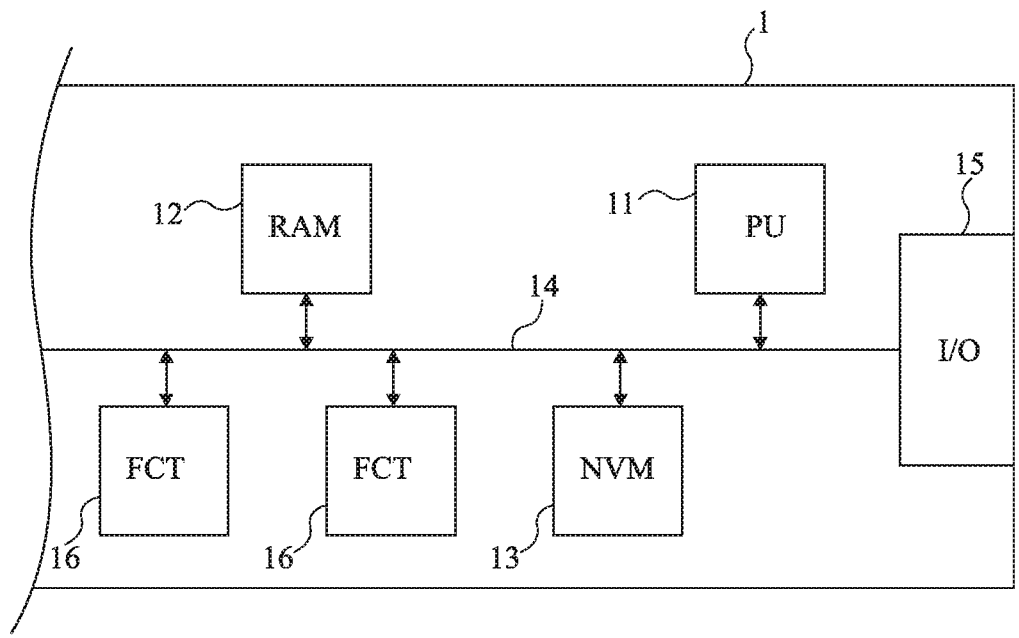
FIG. 1 shows, very schematically and in block form, an embodiment of an electronic circuit.

FIG. 1 shows, very schematically and in block form, an embodiment of an electronic circuit 1 of the type to which the described implementation modes apply.

According to this embodiment, the electronic circuit 1 comprises: one or more digital processing units (PU) 11, for example of the finite state machine, microprocessor, programmable logic circuit, etc., type; one or more volatile (RAM) and/or non-volatile (NVM) storage memories 12, 13 for data and programs; one or more buses 14 for data, addresses and/or commands between the various elements internal to the electronic circuit 1; one or more input-output (I/O) interfaces 15 for communication with the outside of the circuit; and various other circuits as a function of the application, symbolized in FIG. 1 by blocks 16 (FCT).

In most of the applications, the memory 13 can be used to record or store information, parameters, calculation results, etc., specific to the operation of the electronic circuit 1. If applicable, the memory 13 generally communicates with one or more other elements of the system. In the example of FIG. 1, it is considered that the memory 13 exchanges data with the digital processing unit 11, which reads or writes information in the memory 13. The memory 13 is, for example, an electrically erasable programmable read-only memory (EEPROM).

In FIG. 1, the bus 14 allows a transmission of data, in particular between the digital processing unit 11 and the memory 13. The digital processing unit 11 can thus communicate with the memory 13 by sending it, via the bus 14, requests, or instructions, or operating codes (opcodes). These operating codes are generally standardized as a function of the bus 14 chosen to implement the data transmission. The bus 14 is typically a serial bus, for example a synchronous serial data bus of the SPI (Serial Peripheral Interface) type.

In the case where the bus 14 is an SPI bus, the digital processing unit 11 can in particular send the memory an operating code denoted "RDSR". Owing to the RDSR operating code, the digital processing unit 11 can read a status register of the memory 13. The content of this status register is returned, in response to reception of the RDSR operating code, by the memory 13 to the digital processing unit 11. The status register in particular is representative of operations that are allowed or in the process of being executed within the memory 13. To simplify and unless otherwise specified, hereinafter the register of the memory will be likened to the content of this register.

Figure 2:
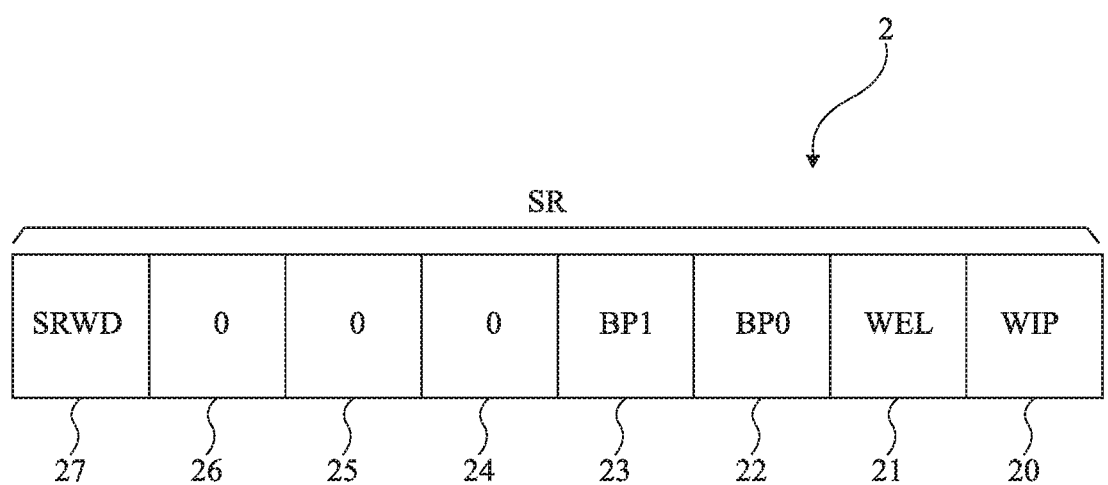
FIG. 2 shows an example of a status register of a memory.

FIG. 2 shows an example of the status register 2 of a memory.

In the example of FIG. 2, the status register (SR) 2 of a memory (for example, the memory 13 in FIG. 1) typically assumes the form of a byte made up of the following eight bits: one bit 20 (WIP—Write In Progress) configured to indicate that a write operation is in progress in the memory; one bit 21 (WEL—Write Enable Latch) for latching the memory in write mode; two bits 22 and 23 (BP0—Block Protection 0 and BP1—Block Protection 1), the combination of which is configured to delimit zones, or ranges, or quadrants of the memory that one wishes to protect in write mode; three bits 24, 25 and 26 whose values are arbitrarily, in this example, set at 0; and one bit 27 (SRWD—Status Register Write Disable) configured to prohibit writing of the status register 2 of the memory.

The bits 22 to 27 of the status register 2 of the memory are generally not intended to be modified during normal use of a product equipped with this memory. A predefined value is therefore generally assigned, in the factory, to each of the bits 22 to 27. Most of the time, the value of each bit 22 to 27 is therefore "hardwired" by an equipment manufacturer implementing such memories. As a specific exemplary application, in the automotive sector, this manufacturer is, for example, an equipment manufacturer supplying on board computers or electronic control units (ECU) to vehicle manufacturers.

Conversely, the bits 20 and 21 (WIP and WEL, respectively) of the status register 2 have values that are generally called upon to change throughout the normal use of a product equipped with such a memory. The values of the bits WIP and WEL are, in particular, modified throughout the write cycles performed on the memory.

By arbitrary convention, 0 or 1 designate the respective states of the bits independently of the electrical levels represented by these states, for example taken to be "high" and "low".

Let us assume, for example, that the values of the WIP and WEL bits are both initially equal to 0 and that one wishes to perform a write cycle in the memory. The values of the WIP and WEL bits of the status register 2 of this memory are then typically modified as follows: the bit WEL is set to the state 1, which means that the write cycle in the memory is authorized; from the beginning of the write cycle, the value of the bit WIP switches to the state 1 to indicate that a write is in progress in the memory; during the write cycle in the memory, the bit WEL is set to the state 0; and once the write cycle is complete, the bit WIP is set to the state 0.

Figure 3:
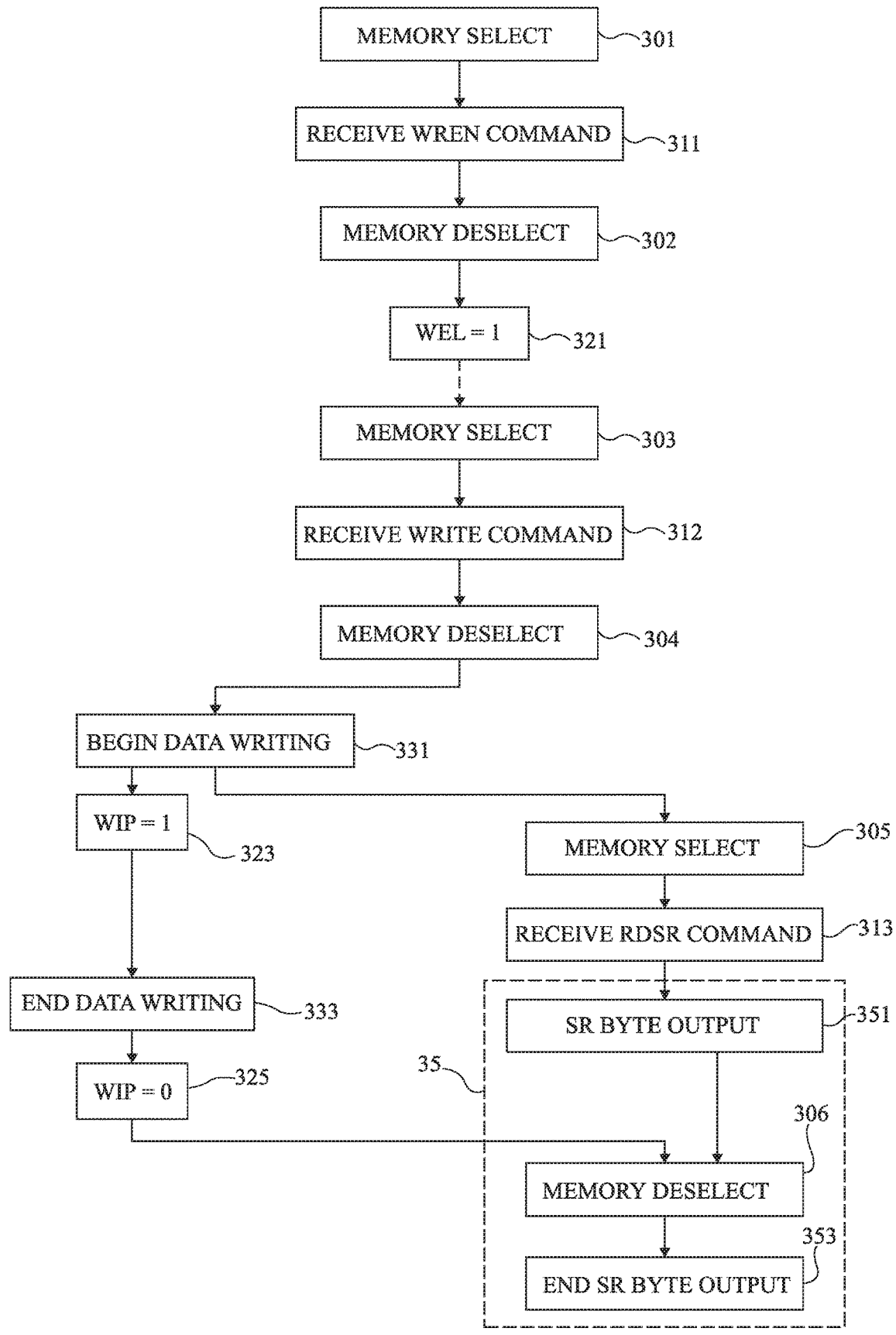
FIG. 3 is a sequence diagram of an embodiment of operations associated with a data writing cycle in a memory via a serial bus.

FIG. 3 is a sequence diagram of an embodiment of operations associated with a data writing cycle in a memory via a serial bus.

According to this embodiment, a digital processing unit (11, FIG. 1) is coupled, preferably connected, to a memory (13, FIG. 1) by a serial bus (14, FIG. 1). It is assumed that the digital processing unit needs to write data in the memory in order, for example, to save information, store a calculation result, etc. To simplify, we will look mainly at the operations that take place on the memory side.

In the example of FIG. 3, a first step (block 301, MEMORY SELECT) consists, for the digital processing unit, of selecting the memory in which it wishes to write one or more data values. The memory then receives (block 311, RECEIVE WREN COMMAND), from the digital processing unit, an operating code, denoted "WREN". The operating code WREN, which precedes the actual write operations, makes it possible to allow writing in the memory. The memory is then deselected (block 302, MEMORY DESELECT) by the digital processing unit. The WEL latch bit of the memory in the write mode then enters the state 1 (block 321, WEL=1).

The digital processing unit then again selects the memory (block 303, MEMORY SELECT). Once the memory is selected, a write command, sent by the digital processing unit, is received by the memory (block 312, RECEIVE WRITE COMMAND). This write command, for example, comprises: one opcode byte; two address bytes; and a certain number of bytes making up the data value or values to be written in the memory.

The memory is next deselected (block 304, MEMORY DESELECT) by the digital processing unit. The deselection of the memory causes the startup of the actual write cycle in the memory (block 331, BEGIN DATA WRITING). The bit WIP then enters the state 1 (block 323, WIP=1). At the end of the actual write operations (block 333, END DATA WRITING), the bit WIP returns to the state 0 (block 325, WIP=0).

According to one preferred embodiment, the memory is, in parallel with the writing operations described above, that is to say, during a duration separating the blocks 331 and 333, selected again (block 305, MEMORY SELECT) by the digital processing unit. The memory then receives (block 313, RECEIVE RDSR COMMAND), from the digital processing unit, another operating code, denoted "RDSR". The operating code RDSR constitutes a continuous sending request from the status register of the memory. The memory, upon receiving the operating code RDSR, then begins, in return, to send its status register (block 351, SR BYTE OUTPUT) to the processing unit.

According to one preferred embodiment, the memory sends (block 351), repeatedly (upon each clock event), via the serial bus, its status register as long as it remains selected by the digital processing unit (or another circuit selecting the memory). This selection is decorrelated from the actual write operations (blocks 331, 323 and 333), the memory being selected by a binary signal distinct from the bus. In the example of FIG. 3, the processing unit commands the deselection of the memory (block 306, MEMORY DESELECT) once the writing operations are complete, that is to say, when the bit WIP returns to the state 0 (block 325). This deselection of the memory interrupts the sending, repeatedly, of the status register of the memory (block 353, END SR BYTE OUTPUT).

During a phase where the bit WIP is at the state 1 and where the memory is selected, the memory therefore sends its status register repeatedly (block 351). In other words, the status register is sent, cyclically or periodically, while the writing cycle takes place in the memory and while the memory remains selected by the processing unit (block 35). This therefore allows the digital processing unit to control an evolution of the status register.

According to one preferred embodiment, the status register of the memory is transmitted synchronously relative to a synchronization signal, or clock signal, used to control the timing of the data transmissions over the serial bus. For example, for a data transmission at a frequency of 1 MHz, a minimum duration of 8 µs separates each transmission, by the memory, of the byte making up the status register. Still according to this example, during a writing cycle with a total duration of 3 ms, the status register can therefore theoretically be transmitted 375 times by the memory. Considering writing cycles of between 1 ms and 4 ms, the status register can then theoretically be transmitted at least 125 times and at most 500 times.

The bit WEL of the status register of the memory is generally reset at any time instant during the execution of the data writing operations. Owing to the embodiment described above, in connection with FIG. 3, it is possible to identify this time instant easily. The update of the status register of the memory and its reading by the digital processing unit throughout the writing operations indeed make it possible to control the time instant when the value of the bit WEL returns to 0.

One advantage of this embodiment is that it allows backwards compatibility with existing communication circuits and methods using an SPI serial bus. A memory (13, FIG. 1) implementing the method described above is, indeed, compatible with standard applications. The embodiment described in connection with FIG. 3 can thus be implemented in an existing circuit, but without disrupting its operation.

Figure 4:
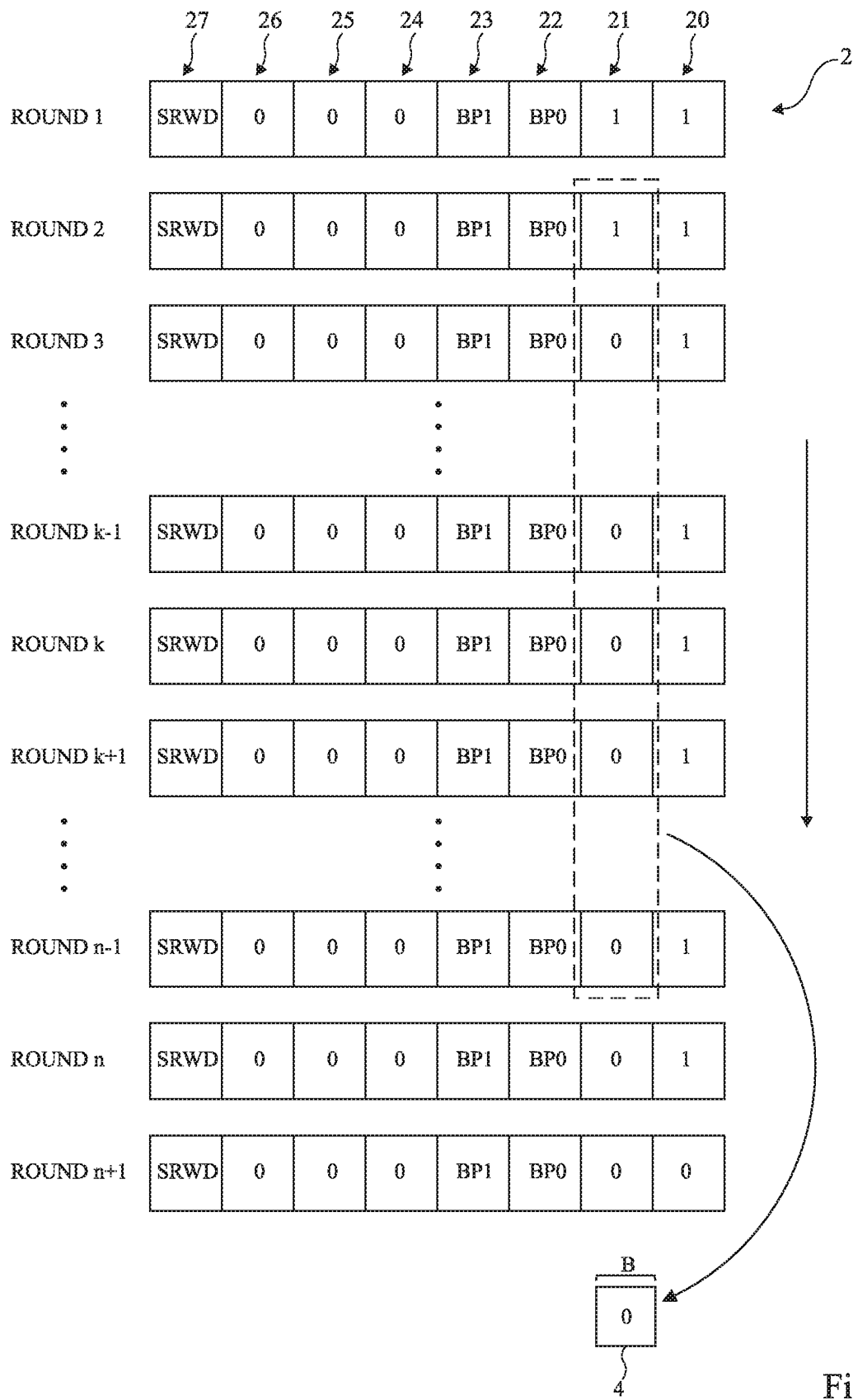
FIG. 4 shows an implementation mode of a method for encoding a data value to be transmitted over a serial bus.

FIG. 4 shows an implementation mode of a method for encoding a data value to be transmitted over a serial bus.

According to this implementation mode, a writing cycle is considered, as described in connection with FIG. 3, during which the memory sends, repeatedly, its status register 2 as long as writing operations are in progress. To simplify, we will only consider the bits 20 (WIP) and 21 (WEL) of the byte forming the status register 2 of the memory. In this example, it is considered that the values of the other bits 22 to 27 do not experience any other evolution throughout the entire writing cycle, and that the bits 20 and 21 represent least significant bits of the status register 2.

During the writing operations, it is assumed that the status register 2 of the memory is updated and sent n times. In other words, it is considered that the transmission repeatedly (block 351, FIG. 3) of the status register of the memory is done n times during a duration separating the block 351 (FIG. 3) from the block 353 (FIG. 3).

Still according to this example, writing operations in the memory take place between a first iteration ROUND 1 and the last iteration ROUND n. In FIG. 4, this results in the fact that, between these two iterations, the value of the bit WIP remains equal to 1, which is a sign that writing operations are in the process of being executed. The bit WIP is set to the state 0 after the last iteration ROUND n, which, in FIG. 4, constitutes a final step ROUND n+1.

In the example of FIG. 4, to simplify, only six intermediate iterations are considered ROUND 2, ROUND 3, ROUND k−1, ROUND k, ROUND k+1 and ROUND n−1. These six intermediate iterations are, still in this example, successively inserted between the first iteration ROUND 1 and the last iteration ROUND n. Other iterations (not shown) can also be inserted between the iterations ROUND 3 and ROUND k−1, on the one hand, and/or between the iterations ROUND k+1 and ROUND n−1, on the other hand. In other words, the iterations temporally appear in the following order: ROUND 1, ROUND 2, ROUND 3, . . . , ROUND k−1, ROUND k, ROUND k+1, . . . , ROUND n−1 and ROUND n.

Upon each new iteration, the content of the status register 2 of the memory can be updated and sent, by the memory, to the serial bus. The status register 2 of the memory is, in this example, updated and sent at least in the successive iterations ROUND 1, ROUND 2, ROUND 3, ROUND k−1, ROUND k, ROUND k+1, ROUND n−1 and ROUND n.

In a writing cycle using an SPI bus, it has previously been described, in connection with FIG. 2, that the reset time instant of the bit WEL could take place at any time between the beginning and the end of the write operations.

According to one preferred implementation, it is proposed to control the reset of the bit WEL, such that this reset takes place at a chosen time instant. In the example of FIG. 4, the bit WEL is deliberately reset (here, the bit WEL is set to the state 0) between iteration ROUND 2 and iteration ROUND 3. Still according to this example, the value of the bit WEL remains equal to 0 for all of the following iterations ROUND 3 to ROUND n.

The intentional or deterministic control of the reset of the bit WEL during the writing operations here makes it possible to encode a data bit 4 (B), or binary data value. It is, for example, possible to choose to reset the bit WEL: either before a certain iteration, for example the iteration ROUND k, in order to encode a low state of bit B; or after this same iteration ROUND k, in order to encode a high state of bit B.

It is thus possible to communicate, for example to a processing unit connected to the memory, the bit B whose value is encoded relative to the time instant where the bit WEL is set to the state 0 during a writing cycle. If the bit WEL is reset before a certain iteration, or a certain time instant or certain duration, this amounts to encoding a first state of the bit B. Conversely, if the bit WEL is reset after this same iteration, or this same time instant or this same duration, this amounts to encoding a second state of the bit B.

According to one implementation mode, this control of the reset of the bit WEL during a writing cycle is used to send a bit B representative of the wear condition of the memory. For example, an intervention is made on the selected time instant to place the bit WEL at the state 0 in order to encode the bit B, for which: a high state makes it possible to indicate that one or more error correction operations have taken place in the memory, which may indicate that the memory is worn; and a low state reflects the fact that no error correction has taken place in the memory, which may mean that the memory is not worn.

According to another implementation mode, it is considered that the value assumed by the bit WEL in the iteration ROUND k, or at a time instant corresponding to the iteration ROUND k, conditions the state of the bit B. In other words, the iteration ROUND k constitutes a reference for the encoding of the bit B. One thus considers, for example: that the bit B is equal to 1 if the bit WEL is equal to 1 at the time of the iteration ROUND k; and that the bit B is equal to 0 if the bit WEL is equal to 0 at the time of the iteration ROUND k.

Still according to this example, one controls, as a function of the value of the bit B that one wishes to send upon each new writing cycle in the memory, the time instant at which the bit WEL is set to state 0 during the considered cycle. Assuming that one wishes to encode a state 0 of the bit B during a writing cycle, the bit WEL will be set to state 0 during an iteration preceding the iteration ROUND k (for example, during the iteration ROUND 2). The bit WEL will next be kept at state 0 until the end of the writing cycle, such that the value of the bit WEL will be equal to 0 at the time of the iteration ROUND k.

Assuming that one next wishes to encode a state 1 of the bit B during another writing cycle, the bit WEL will be set to the state 0 during an iteration after the iteration ROUND k (for example, during the iteration ROUND n−1). The bit WEL will thus be kept at the state 1 at least until the iteration ROUND k.

From one writing cycle to another, it is possible to decide to reset (set to the state 0) the bit WEL deterministically in ranges of iterations before or after the iteration k serving as reference. For example, one may decide that the bit WEL will always be set to the state 0: in the iteration ROUND 2 in order to encode a value 0 of the bit B; and in the iteration ROUND n−1 in order to encode a value 1 of the bit B.

In a variant, the bit WEL could be reset randomly in the ranges of iterations before or after the iteration k serving as reference. For example, it is possible to encode: a state 0 of the bit B by resetting the bit WEL in an iteration randomly chosen from among the iterations prior to the iteration ROUND k; and a state 1 of the bit B by only resetting the bit WEL in an iteration randomly chosen from among the iterations after to the iteration ROUND k.

Figure 5:
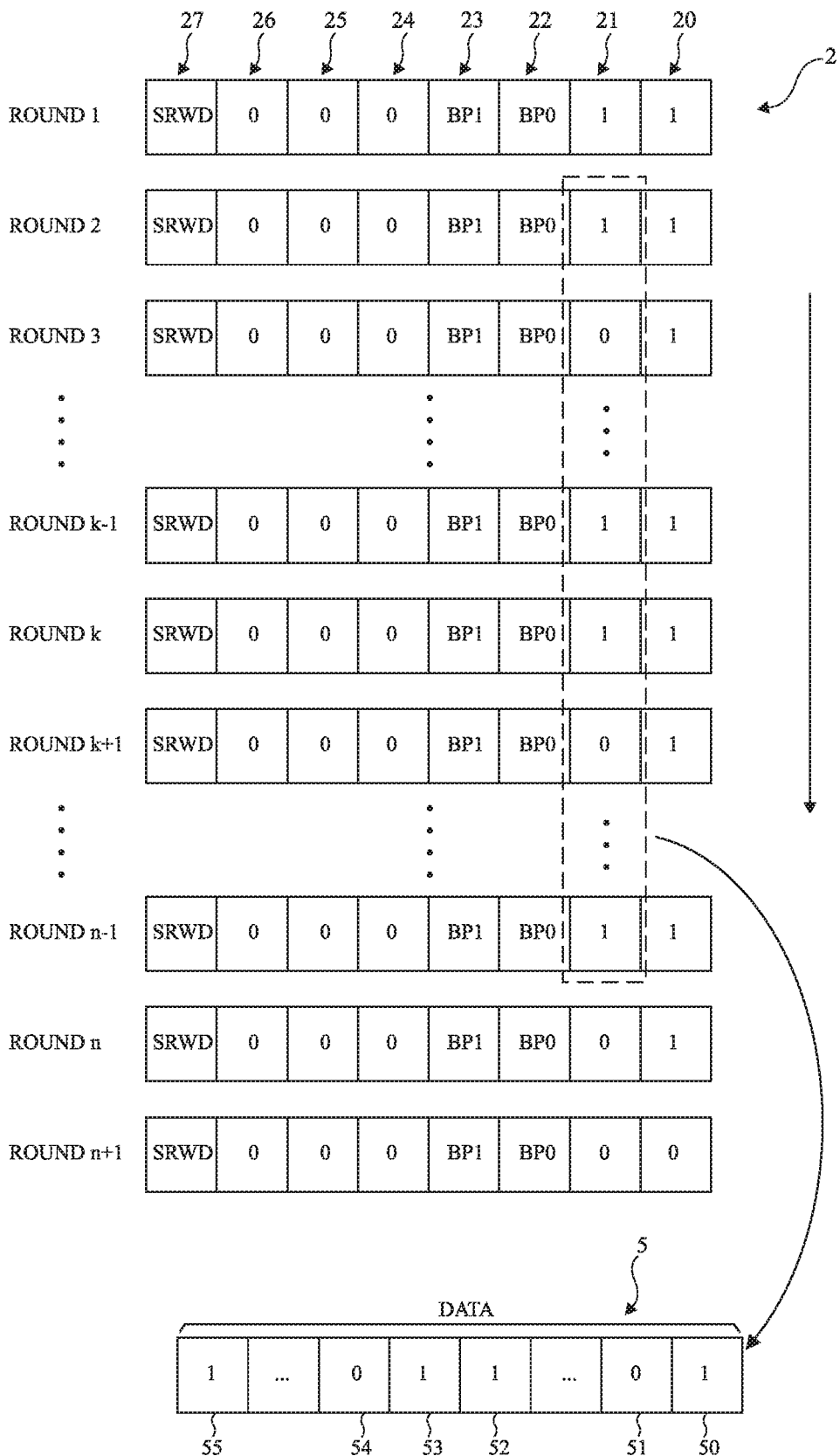
FIG. 5 shows another implementation mode of a method for encoding a data value to be transmitted over a serial bus.

FIG. 5 shows another implementation mode of a method for encoding a data value to be transmitted over a serial bus.

According to this implementation mode, a writing cycle is considered comprising n iterations as described in connection with FIG. 4. To simplify, we will only consider the bits 20 (WIP) and 21 (WEL) of the byte forming the status register 2 of the memory. In this example, it is considered that the values of the other bits 22 to 27 do not experience any evolution throughout the entire writing cycle. Still in this example, it is assumed that the status register 2 of the memory is updated and sent over the SPI bus at least in the successive iterations ROUND 1, ROUND 2, ROUND 3, ROUND k−1, ROUND k, ROUND k+1, ROUND n−1 and ROUND n.

During a writing cycle using, for example, an SPI serial bus, the value of the bit WEL can be modified a plurality of times during the writing. It is therefore possible to extend the principle of encoding one bit, described in connection with FIG. 4, to encoding a plurality of bits forming a data value or word 5 (DATA). To that end, the value assumed by the bit WEL of the status register 2 is controlled upon each new iteration of the loop for updating and transmitting the status register 2 of the memory.

In the example of FIG. 5, the value of the bit WEL is imposed for each iteration comprised between ROUND 2 and ROUND n−1. This makes it possible to encode, for each new iteration, a bit of the data value DATA whose value is equal to the value of the bit WEL in the considered iteration. Thus, in the example of FIG. 5, the data value DATA forms a word comprising in particular: a bit 50, the value of which is equal to the value of the bit WEL in the iteration ROUND 2; a bit 51, the value of which is equal to the value of the bit WEL in the iteration ROUND 3; a bit 52, the value of which is equal to the value of the bit WEL in the iteration ROUND k−1; a bit 53, the value of which is equal to the value of the bit WEL in the iteration ROUND k; a bit 54, the value of which is equal to the value of the bit WEL in the iteration ROUND k+1; and a bit 55, the value of which is equal to the value of the bit WEL in the iteration ROUND n−1.

For a transmission cycle during which the status register 2 of the memory is updated and transmitted n times, it is thus theoretically possible to send, via the serial bus, a data value DATA comprising up to n−2 bits. For example, for a writing cycle, in the memory, paced at a frequency of 10 MHz and spreading over a duration of 1 ms, it is possible to send, via the serial bus, a data value DATA having about 1000 bits (1 kb). This amounts to creating a new data transmission channel on the serial bus.

In the example of FIG. 5, the bits 50 to 55 of the data value DATA are sent, in order, from the bit with the lowest significance (bit 50) to the bit with the highest significance (bit 55), which is not mandatory. It is indeed possible to provide for sending the bits 50 to 55 of the data value DATA in another order, for example in an order resulting from a permutation.

In the example of FIG. 5, the status register 2 undergoes, during a same writing cycle in the memory, a number of modifications related to the number of state transitions between the bits successively sent of the word 5.

The different implementation modes and variants, described above in connection with FIGS. 4 and 5, can be implemented: by a circuit, for example the circuit 1 (FIG. 1); and/or by a non-volatile memory, for example the memory 13 (FIG. 1), the status register 2 of which is configured to be modified as described.

Various embodiments, implementation modes and variants have been described. One skilled in the art will understand that certain features of these various embodiments, implementation modes and variants can be combined, and other variants will appear to one skilled in the art. In particular, the encoding of a bit B as described in connection with FIG. 4 can be repeated, during successive writing cycles, in order, for example, to encode a plurality of bits B together forming one or more data values. Likewise, the encoding of a data value DATA as described in connection with FIG. 5 can be repeated, during successive writing cycles, in order, for example, to encode a plurality of data values DATA forming, after recombination (for example, after concatenation), another data value that is not transmissible during a single writing cycle in the memory.

Lastly, the practical implementation of the described embodiments, implementation modes and variants is within the reach of one skilled in the art from functional indications provided above. In particular, the bit B and the data value DATA can represent any type of information or information portion, for example information representing a state of wear of the memory or a number of error corrections done during a determined duration.

The invention claimed is:

1. A method for encoding a data value to be transmitted on an SPI serial bus, comprising:
modifying a status register of a memory a plurality of times, at a plurality of chosen time instants during a write cycle in the memory, as a function of all or part of said data value to be transmitted.

2. The method according to claim 1, wherein the memory is a reprogrammable non-volatile memory.

3. The method according to claim 1, wherein modifying the status register comprises performing a state inversion of a latch bit of the memory.

4. The method according to claim 1, wherein the data value to be transmitted comprises a word having at least two bits.

5. The method according to claim 4, wherein a number of modifications of the status register that are performed, during the write cycle in the memory, is related to a number of state transitions between successively transmitted bits of the word.

6. The method according to claim 1, wherein said data value to be transmitted is representative of wear condition of the memory.

7. The method according to claim 1, wherein said data value to be transmitted reflects a number of error corrections made within the memory.

8. The method according to claim 1, further comprising:
starting to write in the memory;
sending, periodically, contents of the status register of the memory;
modifying, at each chosen time instant, the status register of the memory to encode all or part of the data value to be transmitted; and
ceasing to write in the memory.

9. An electronic circuit, comprising:
an SPI serial bus;
a memory having a status register; and
a circuit configured to encode a data value to be transmitted on the SPI serial bus by modifying the status register of the memory a plurality of times, at a plurality of chosen time instants during a write cycle in the memory, as a function of all or part of said data value to be transmitted.

10. The electronic circuit according to claim 9, wherein the memory is a reprogrammable non-volatile memory.

11. The electronic circuit according to claim 9, wherein said circuit modifies the status register by performing a state inversion of a latch bit of the memory.

12. The electronic circuit according to claim 9, wherein the data value to be transmitted comprises a word having at least two bits.

13. The electronic circuit according to claim 12, wherein a number of modifications of the status register that are performed during the write cycle in the memory is related to a number of state transitions between successively transmitted bits of the word.

14. The electronic circuit according to claim 9, wherein said data value to be transmitted is representative of wear condition of the memory.

15. The electronic circuit according to claim 9, wherein said data value to be transmitted reflects a number of error corrections made within the memory.

16. The electronic circuit according to claim 9, wherein said circuit is configured to:
start to write in the memory;
send, periodically, contents of the status register of the memory;
modify, at each chosen time instant, the status register of the memory to encode all or part of the data value to be transmitted; and
cease to write in the memory.

17. A memory circuit, comprising:
a non-volatile memory; and
a status register; and
a circuit configured to encode a data value by modifying the status register of the non-volatile memory a plurality of times, at a plurality of chosen time instants during a write cycle of the non-volatile memory, as a function of all or part of said data value.

18. The memory circuit according to claim 17, wherein said circuit modifies the status register by performing a state inversion of a latch bit of the non-volatile memory in write mode.

19. The memory circuit according to claim 17, wherein the data value comprises a word having at least two bits.

20. The memory circuit according to claim 19, wherein a number of modifications of the status register that are performed, during the write cycle in the non-volatile memory, is related to a number of state transitions between successively transmitted bits of the word.

21. The memory circuit according to claim 17, wherein said data value is representative of wear condition of the non-volatile memory.

22. The memory circuit according to claim 17, wherein said data value reflects a number of error corrections made within the non-volatile memory.

23. The memory circuit according to claim 17, wherein said circuit is configured to:
start to write in the non-volatile memory;
send, periodically, contents of the status register of the non-volatile memory;
modify, at said given time instant, the status register of the non-volatile memory to encode all or part of the data value; and
cease to write in the non-volatile memory.

* * * * *